(12) United States Patent
Laureanti

(10) Patent No.: US 6,395,569 B1
(45) Date of Patent: May 28, 2002

(54) METHOD FOR CHARACTERIZATION OF LDMOS DEVICES AT THE DIE REFERENCE PLANE

(75) Inventor: Steven J. Laureanti, Lewisville, TX (US)

(73) Assignee: Ericsson Inc., Plano, TX (US)

(*) Notice: Subject to any disclaimer, the term of this patent is extended or adjusted under 35 U.S.C. 154(b) by 0 days.

(21) Appl. No.: 09/760,571

(22) Filed: Jan. 15, 2001

(51) Int. Cl.[7] ............................................. H01L 21/66
(52) U.S. Cl. ............................ 438/18; 438/14; 438/15; 438/16; 438/17
(58) Field of Search ............................. 438/14, 15, 16, 438/17, 18

(56) References Cited

U.S. PATENT DOCUMENTS 5,264,712 A * 11/1993 Murata et al. ................ 257/71
6,022,750 A * 2/2000 Akram et al. ................. 438/18
6,068,818 A * 5/2000 Ackley et al. ................ 422/50
6,084,267 A * 7/2000 Petrosino ..................... 257/341
6,194,739 B1 * 2/2001 Ivanov et al. ................. 257/48
6,265,765 B1 * 7/2001 DiStefano et al. .......... 257/678

* cited by examiner

Primary Examiner—John F. Niebling
Assistant Examiner—Olivia T Luk
(74) Attorney, Agent, or Firm—Michael T. Konczal; Arthur I. Navarro; Godwin Gruber, P.C.

(57) ABSTRACT

Method for characterization of Laterally Diffused Metal Oxide Semiconductors (LDMOS) at the die reference plane. An LDMOS device is epoxied to a midsection for connection to a test fixture for characterization. The combined physical parameters of the LDMOS device and test fixture are determined. Next, the measurements obtained are adjusted for the physical parameters of the test fixture alone, isolating the physical parameters characterizing the LDMOS device at the die reference plane.

18 Claims, 2 Drawing Sheets

METHOD FOR CHARACTERIZATION OF LDMOS DEVICES AT THE DIE REFERENCE PLANE

TECHNICAL FIELD

This invention relates in general to characterization methods for use with LDMOS devices. More particularly, the invention relates to methods for characterization of LDMOS devices at the die reference plane.

BACKGROUND OF THE INVENTION

Recently introduced Laterally Diffused Metal Oxide Semiconductors (LDMOS) increase operating frequency of silicon power FETs. LDMOS semiconductors incorporate a P+ sinker to connect the source terminal to the chip's backside. With this structure, chips can be directly attached to metal bases, both to improve grounding and to reduce thermal resistance. LDMOS technology makes it possible to produce RF power transistors having high gain, useable efficiency, low thermal resistance, and superior performance when applied in cellular communication systems. High quality LDMOS products known in the arts such as, for example, devices available from Ericsson Telefonaktiebolaget L.M. of Sweden, employ gold metalization and gold wire connections. The use of gold eliminates temperature and metal fatigue problems associated with the use of other metals in LDMOS products. The use of gold at the source terminal of the LDMOS chip creates a problem with attaching the device to metallic midsections known in the art for device property characterization.

Various performance measurements and physical properties can be determined by the characterization of semiconductor materials and semiconductor devices. Many characterization parameters can be measured, such as for example, power-input versus output, 1 dB compression point, impedance, gain versus frequency, efficiency, temperature effects, and power versus voltage. Other property and performance parameters can be measured depending on design criteria. A problem associated with device characterization is that it is difficult to characterize a device alone without including characterization of parasitic measurements of the test equipment as well.

The characterization of state-of-the-art LDMOS devices is beset with additional problems due to the use of gold on the base of the device. The gold base makes the interconnection between a device and the test equipment difficult. Mechanical fastenings and/or specialized soldering techniques can be used, but tend to introduce parasitic measurements into characterization efforts. Similarly, packaged LDMOS devices can be characterized, but problems then remain with attempting to distinguish between device and package characteristics. Another difficulty sometimes encountered is that a test configuration should not preclude subsequent use of the device.

Accordingly, a need exists for a better way of characterizing properties of semiconductor devices such as LDMOS.

SUMMARY OF THE INVENTION

Disclosed are methods for characterization of Laterally Diffused Metal Oxide Semiconductors (LDMOS). The methods characterize LDMOS devices at the die reference plane. An LDMOS device is epoxied to a midsection for connection to a test fixture for characterization. The combined physical parameters of the LDMOS device and test fixture are determined. Next, the measurements obtained are adjusted for the physical parameters of the test fixture alone, isolating the physical parameters characterizing the LDMOS device at the die reference plane. The methods have an advantage in providing characterization of LDMOS devices at the die reference plane with more accuracy than previous methods.

In the preferred embodiment of the invention, the LDMOS device source terminal is epoxied to a midsection for testing, which provides a ground plane for the LDMOS device.

The invention disclosed provides many advantages by reducing the possibility of parasitic measurements. Epoxying the LDMOS device directly to the midsection eliminates some of the variability in the test fixture configuration commonly found in the arts.

Further technical advantages are obtained by wire-bonding the LDMOS device to the test fixture transmission lines, further reducing parasitic measurements.

The practice of the invention has additional advantages in simplifying the characterization of the performance of a LDMOS device at the die reference plane, thereby decreasing the time-to-market of device product development, and reducing costs.

BRIEF DESCRIPTION OF THE DRAWINGS

The above advantages, as well as specific embodiments of the present invention, will be more clearly understood from consideration of the following descriptions in connection with accompanying drawings in which.

Corresponding numerals and symbols in the various figures refer to corresponding parts unless otherwise indicated.

DETAILED DESCRIPTION OF PREFERRED EMBODIMENTS

While the making and using of various embodiments of the present invention are discussed in detail below, it should be appreciated that the present invention provides many applicable inventive concepts which can be embodied in a wide variety of specific contexts. It should be understood that the invention may be practiced with LDMOS devices of various types for the measurement of various parameters. Some features of embodiments shown and discussed are. simplified or exaggerated for illustrating the principles of the invention.

Figure 1:
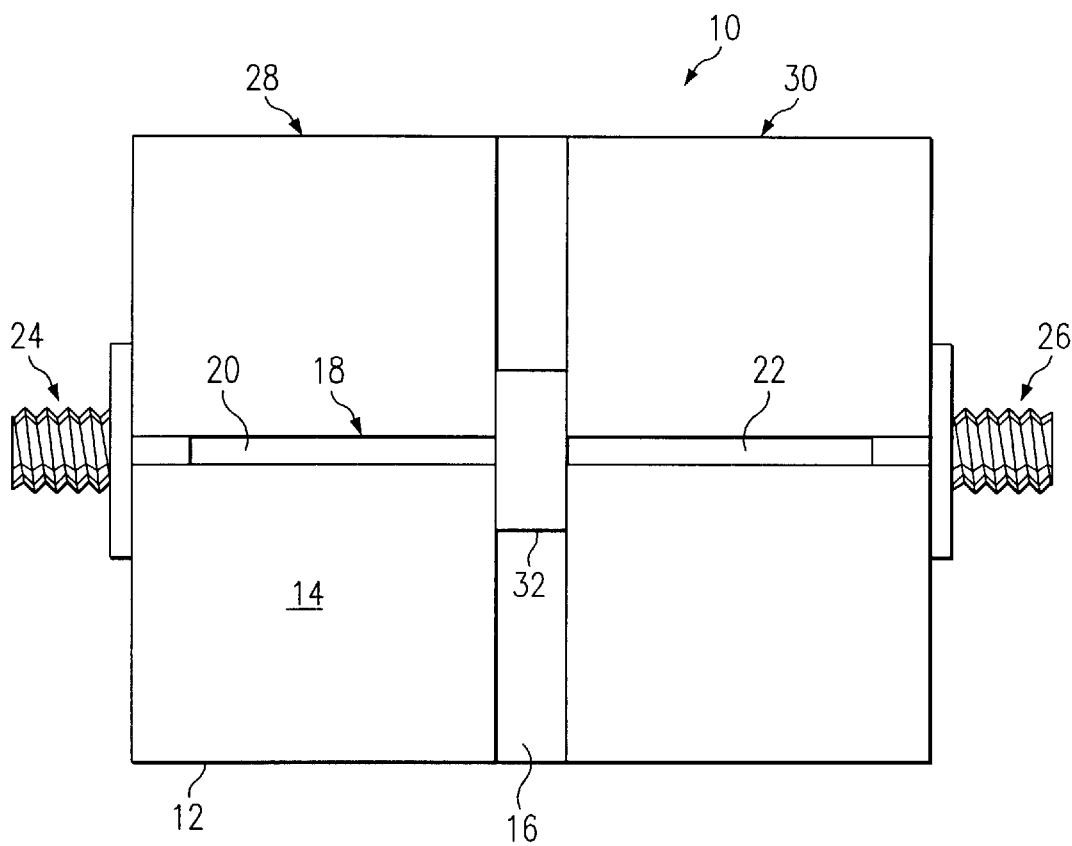
FIG. 1 is a top view of a test fixture.

FIG. 1 is a top view of a test fixture 10 generally known in the arts. The test fixture 10 has a base plate 12, typically mounted on a heat sink or hot/cold plate (not shown). The planar surface 14 of the test fixture base plate 12 is divided into three regions. A central portion 16 bisects the plane of the base plate surface 14 and is designed for receiving a midsection block 32 (referred to also as "midsection") further described and shown in FIG. 2 below. The surface 14 of the base plate 12 is crossed in the direction perpendicular to the central portion 16 by a transmission line 18. The transmission line 18 is bisected by the central portion 16 and has on one side, an input transmission line segment 20, and on the opposite side, an output transmission line segment 22.

The input transmission line segment 20 is connected to an input connector 24. Similarly, the output transmission line segment 22 is connected to an output connector 26. Input and output connectors 24, 26, are designed for coupling to external transmission lines such as coaxial cables (not shown) for connection to a power source. The region of the surface 14 to the left of the central portion 16 in FIG. 1 is denominated the input section 28 and the region opposite is denominated the output section 30. Of course, the input/output and left/right designations used herein are used for reference purposes only and are not limitations on the physical orientation of the invention.

Figure 2:
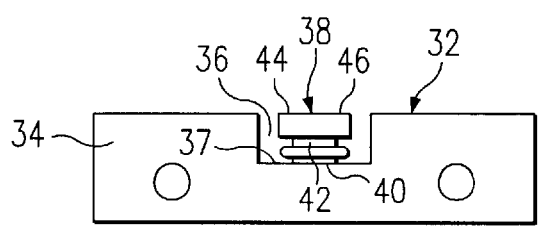
FIG. 2 is a side view of an example of a midsection with an LDMOS device attached.

Now referring to FIG. 2, the midsection 32 is shown in side view. The midsection body 34 is typically made of a highly conductive metal and is designed to be received into central portion 16 of the test fixture 10. The midsection body 34 has a slot 36 for mounting of an LDMOS device 38 for testing. According to the principles of the invention, the LDMOS device 38 is affixed to the slot 36 in the midsection body 34 with an epoxy resin 40. The epoxy resin 40 is a good conductor of electricity. Preferably, the epoxy resin 40 mechanically and electrically couples the source terminal 42 of the LDMOS device 38 to the conductive midsection body 34, which provides a ground plane for the source terminal 42 of the LDMOS device 38.

Figure 3:
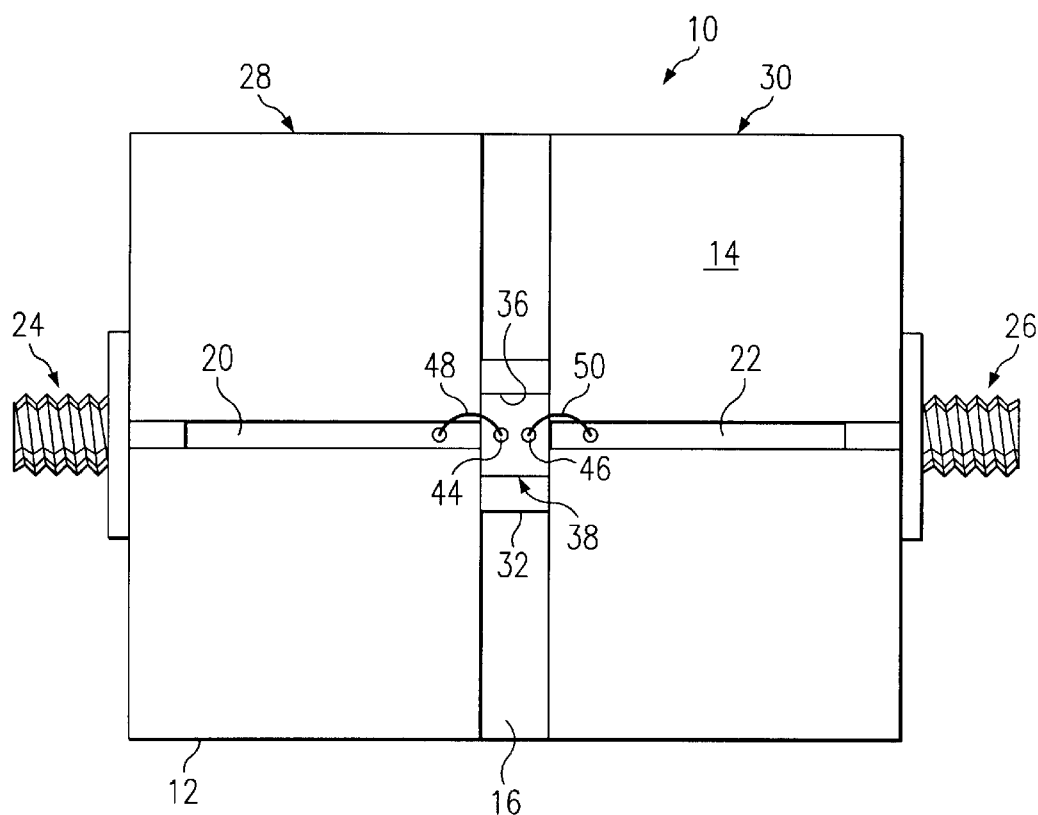
FIG. 3 is a top view of the test fixture of FIG. 1 with the midsection and LDMOS device of FIG. 2 positioned for characterization of the LDMOS device.

Understanding of the principles of the invention is further enhanced by reference to FIG. 3 showing the midsection 32 of the text fixture 10 with an LDMOS device 38 attached, positioned in the central portion 16 of the test fixture 10 in an orientation that brings the LDMOS input gate 44 into alignment with the input transmission line segment 20. Similarly, it is preferred that LDMOS device 38 output drain 46 is aligned with output transmission line segment 22. Preferably, LDMOS input gate 44 is electrically coupled to input transmission line segment 20 with a wire-bond 48, preferably using gold wire and a thermo-compression bonding technique, although other conductive wires (such as Aluminum) may be used as well as other bonding techniques (such as ultrasonic or thermo-sonic bonding). It is preferred that the device output drain 46 is wire-bonded 50 to output transmission line segment 22 in the same manner.

Figure 4:
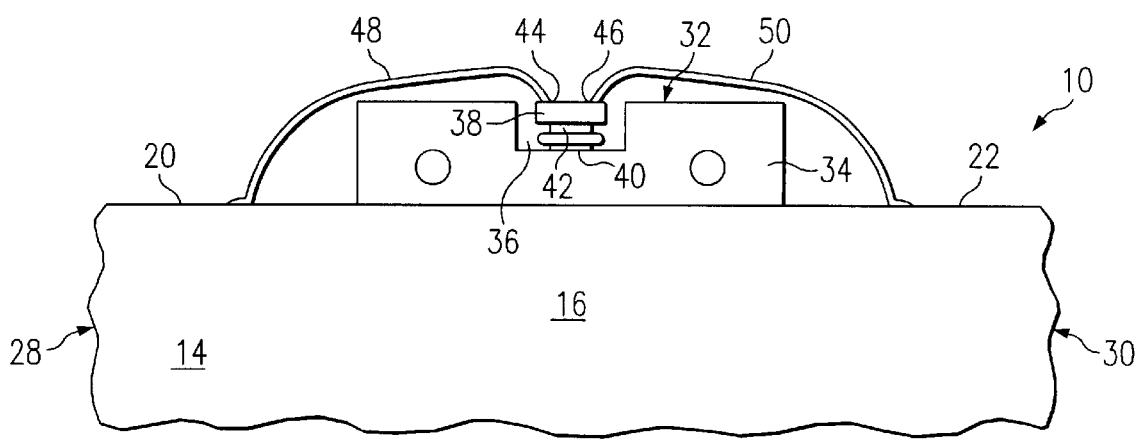
FIG. 4 is a close-up side view of the invention as shown in FIG. 3.

A close-up view illustrating practice of the invention is shown in FIG. 4. As can be seen in this side view, an LDMOS device 38 is epoxied 40 to the slot 36 of a midsection body 34. The midsection 32 contacts the central portion 16 of a test fixture surface 14. The LDMOS device 38 is oriented so that the LDMOS input gate 44 is adjacent to the input transmission line segment 20 and the LDMOS device 38 output drain 46 is adjacent to the output transmission line segment 22. Preferably, a gold input wire 50 is wire-bonded to the LDMOS device input gate 44 at one end 52 and to the input transmission line segment 20 at its opposite end 54. Similarly, an output gold wire 56 is attached to the LDMOS device output drain 46 at one end 58 and to the output transmission line segment 22 at its opposing end 60.

In practice, the characterization process begins wherein the individual device 38 die, removed from the wafer on which it was manufactured, is mounted directly to the midsection slot surface 37 using epoxy 40. The epoxy 40 provides both a mechanical and an electrical coupling of the source terminal 42 at the back side of the device 38 with the metal plane of the midsection 32. Preferably, the input section 28 and output section 30 of the fixture 10 are de-embedded using Through-Reflect-Line (TRL) 2-port calibration procedure. Other calibration methods, such as Open-Short-Load Through (OSLT), Line-Reflect-Match (LRM), or Line-Reflect-Reflect-Match (LRRM), may also be used.

The midsection 32 is attached to the central portion 16 of the fixture 10 device. The device 38 input gate 44 and output drain 46 are wire-bonded to the input and output transmission line segments 20, 22, respectively. Since the device 38 is mechanically and electrically coupled to the midsection 32 by the epoxy joint 40, the midsection 32 functions as both a heat sink for dissipated energy during the characterization of the device 38, and a ground plane for the device 38. Characterization parameters, such as power-input versus output, 1 dB compression point, impedance, gain versus frequency, efficiency, temperature effects, power versus voltage, and other device characteristics can then be measured. Following characterization, the device 38 may be removed from the midsection 32 for use elsewhere.

The embodiments shown and described above are only exemplary, even though numerous characteristics and advantages of the present invention have been set forth in the foregoing description, together with details of the method of the invention. This disclosure is illustrative only and changes may be made within the principles of the invention to the full extent indicated by the broad general meaning of the terms used in the attached claims.

I claim:

1. A method for characterization of a Laterally Diffused Metal Oxide Semiconductor (LDEMOS) device comprising the steps of:

(a) epoxying an LDMOS device to the midsection of a test fixture, the midsection adapted to provide a ground plane for the source terminal of the LDMOS device:
   wire bonding the input gate of the LDMOS device to an input transmission line of the test fixture;
   wire bonding the output drain of the LDMOS device to an output transmission line of the test fixture;

(b) measuring the combined physical parameters of the LDMOS device and the test fixture; and (c) de-embedding the physical paramotors of the test fixture to isolate the physical parameters characterizing the LDMOS device at the die reference plane.

2. The method of claim 1 wherein step (c) is performed using a Thru-Reflect-Line two-port calibration procedure.

3. The method of claim 1 wherein step (c) is performed using an Open-Short-Load Through calibration procedure.

4. The method of claim 1 wherein step (c) is performed using a Line-Reflect-Match calibration procedure.

5. The method of claim 1 wherein step (c) is performed using a Line-Reflect-Reflect-Match calibration procedure.

6. The method of claim 1 wherein step (c) further comprises the step of measuring the test fixture input section parameters and the test fixture output section parameters independently.

7. The method of claim 1 wherein step (c) further comprises the step of measuring the wire bond parameters independently.

8. The method of claim 1 wherein the wire bonding steps are performed using gold wire.

9. The method of claim 1 wherein the wire bonding steps are performed using aluminum wire.

10. The method of claim 1 wherein the wire bonding steps further comprise thermo-compression bonding.

11. The method of claim 1 wherein the wire bonding steps further comprise ultrasonic bonding.

12. The method of claim 1 wherein the wire bonding steps further comprise thermo-sonic bonding.

13. The method of claim 1 wherein isolating the physical parameters characterizing the LDMOS device at the die reference plane further comprises isolating a 1 dB compression point.

14. The method of claim 1 wherein isolating the physical parameters characterizing the LDMOS device at the die reference plane further comprises isolating impedance.

15. The method of claim 1 wherein isolating the physical parameters characterizing the LDMOS device at the die reference plane further comprises isolating a ratio of gain to frequency.

16. The method of claim 1 wherein isolating the physical parameters characterizing the LDMOS device at the die reference plane further comprises isolating a ratio of power to voltage.

17. The method of claim 1 wherein isolating the physical parametors characterizing the LDMOS device at the die reference plane further comprises isolating efficiency.

18. The method of claim 1 wherein isolating the physical parameters characterizing the LDMOS device at the die reference plane further comprises isolating temperature effects.

* * * * *